United States Patent
Chang et al.

(10) Patent No.: US 12,354,929 B2
(45) Date of Patent: Jul. 8, 2025

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Kai-Fung Chang, Taipei (TW); Sheng-Feng Weng, Taichung (TW); Ming-Yu Yen, MiaoLi County (TW); Wei-Jhan Tsai, Kaohsiung (TW); Chao-Wei Chiu, Hsinchu (TW); Chao-Wei Li, Hsinchu (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 496 days.

(21) Appl. No.: 17/890,262

(22) Filed: Aug. 17, 2022

(65) Prior Publication Data
US 2024/0063081 A1 Feb. 22, 2024

(51) Int. Cl.
*H01L 23/48* (2006.01)
*H01L 21/768* (2006.01)
(Continued)

(52) U.S. Cl.
CPC .... *H01L 23/3677* (2013.01); *H01L 21/76898* (2013.01); *H01L 23/481* (2013.01);
(Continued)

(58) Field of Classification Search
CPC ............ H01L 23/3677; H01L 21/76898; H01L 23/481; H01L 23/49816; H01L 23/49833; H01L 23/49838; H01L 24/08; H01L 24/80; H01L 23/49822; H01L 2224/08056; H01L 2224/08059; H01L 2224/08225; H01L 2224/80097; H01L 2224/80895;
(Continued)

(56) References Cited

U.S. PATENT DOCUMENTS 8,993,380 B2 3/2015 Hou et al.
9,281,254 B2 3/2016 Yu et al.
(Continued)

*Primary Examiner* — Niki H Nguyen
(74) *Attorney, Agent, or Firm* — JCIPRNET

(57) ABSTRACT

A package structure including a semiconductor die, an encapsulant, a redistribution structure, and a through insulating via is provided. The first redistribution structure includes an insulating layer and a circuit layer. The semiconductor die is disposed on the first redistribution structure. The semiconductor die includes a semiconductor base, through semiconductor vias, a dielectric layer, and bonding connectors. Through semiconductor vias penetrate through the semiconductor base. The dielectric layer is disposed on a backside of the semiconductor base. The dielectric layer of the semiconductor die is bonded with the insulating layer of the first redistribution structure. The bonding connectors are embedded in the dielectric layer and connected to the through semiconductor vias. The bonding connectors of the semiconductor die are bonded with bonding pads of the circuit layer. The encapsulant is disposed on the first redistribution structure and encapsulates the semiconductor die.

20 Claims, 12 Drawing Sheets

(51) Int. Cl.
  *H01L 23/00* (2006.01)
  *H01L 23/367* (2006.01)
  *H01L 23/498* (2006.01)
  *H01L 23/52* (2006.01)
  *H01L 29/40* (2006.01)

(52) U.S. Cl.
  CPC .. *H01L 23/49816* (2013.01); *H01L 23/49833* (2013.01); *H01L 23/49838* (2013.01); *H01L 24/08* (2013.01); *H01L 24/80* (2013.01); *H01L 23/49822* (2013.01); *H01L 2224/08056* (2013.01); *H01L 2224/08059* (2013.01); *H01L 2224/08225* (2013.01); *H01L 2224/80097* (2013.01); *H01L 2224/80895* (2013.01); *H01L 2224/80896* (2013.01); *H01L 2924/182* (2013.01); *H01L 2924/3511* (2013.01); *H01L 2924/37001* (2013.01)

(58) Field of Classification Search
  CPC ..... H01L 2224/80896; H01L 2924/182; H01L 2924/3511; H01L 2924/37001; H01L 24/16; H01L 2924/15311; H01L 2225/06541; H01L 25/0657; H01L 2224/16145; H01L 2224/32145; H01L 2225/06513; H01L 2924/181; H01L 2224/16227; H01L 24/81; H01L 25/0655; H01L 23/3128; H01L 2224/0401; H01L 2224/81; H01L 25/0652; H01L 2224/97; H01L 24/73; H01L 2924/18161; H01L 2225/06517; H01L 2225/06548; H01L 24/05; H01L 2225/1058; H01L 23/49827; H01L 2225/065101; H01L 121/486; H01L 23/5384; H01L 2224/08145; H01L 23/3107; H01L 2224/0239; H01L 2224/08146; H01L 24/06; H01L 2224/13009; H01L 2224/48145; H01L 2224/81801; H01L 2224/06517; H01L 2224/06519; H01L 2224/09517; H01L 2224/24145; H01L 2224/73203; H01L 2224/73207; H01L 2224/0603; H01L 2224/08237; H01L 2224/16237; H01L 2224/48228; H01L 2224/32237; H01L 2225/1011; H01L 2224/1308; H01L 2224/49174

See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,504,835 B1* | 12/2019 | Wang | H01L 23/53238 |
| 2019/0006315 A1* | 1/2019 | Hsu | H01L 21/6835 |

\* cited by examiner

PACKAGE STRUCTURE AND MANUFACTURING METHOD THEREOF

BACKGROUND

As semiconductor device sizes have decreased, the density of devices has increased. Along with such increases in processing power, however, has also come an increase in the amount of heat generated by the package devices. As is to be expected, excessive amounts of heat present in the package devices could and typically does decrease device performance. A prolonged exposure to excessive temperatures may decrease the reliability and operating lifetime of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
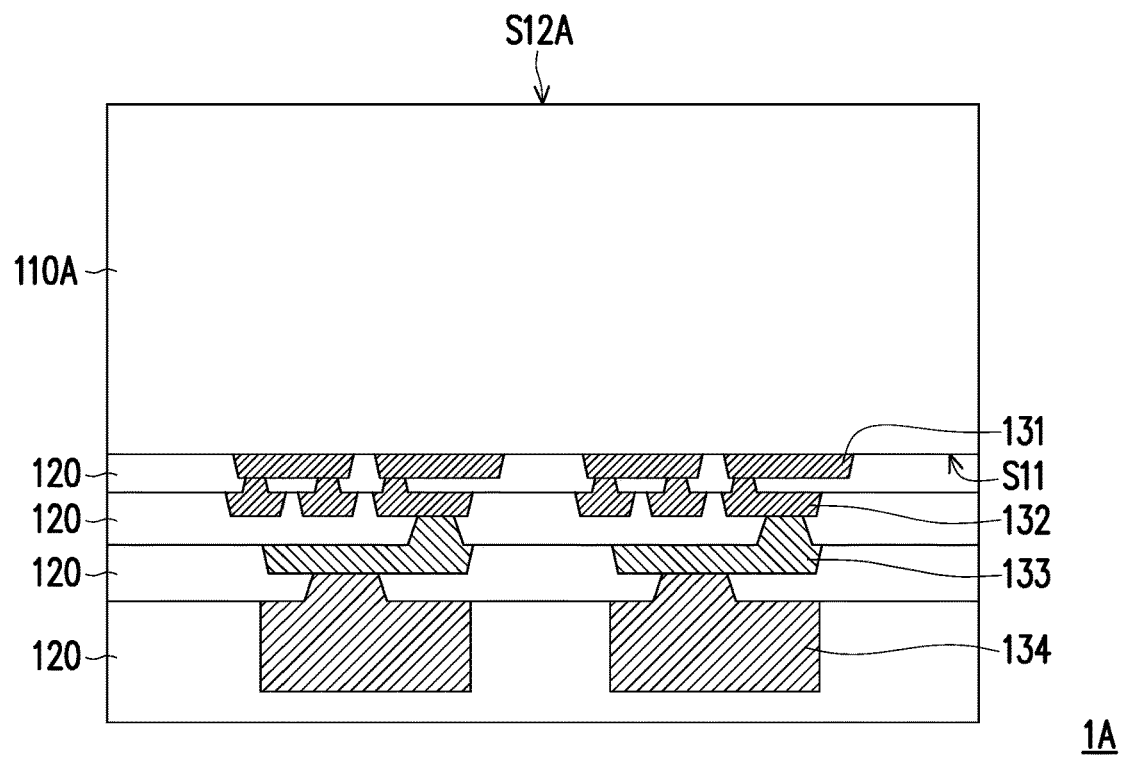
FIG. 1 to FIG. 12 are schematic cross-sectional views illustrating a manufacturing process of a package structure in accordance with an embodiment of the disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 12 are schematic cross-sectional views illustrating a manufacturing process of a package structure in accordance with an embodiment of the disclosure.

Referring to FIG. 1, a wafer 1A having a semiconductor base 110A having a first surface S11 and a second surface S12A opposite to the first surface S11 is provided. The wafer 1A may be a semiconductor bulk wafer, for example, a silicon wafer, s silicon on insulator (SOI) wafer or a suitable semiconductor material wafer. The semiconductor base 110A of the wafer 1A may have at least one device region with active elements such as transistors formed by semiconductor manufacturing processes (e.g., front end of line (FEOL) processes). The wafer 1A may be disposed over a carrier such as a block carrier or a wafer chuck (not shown) having a with a release layer (e.g., a back grinding (BG) tape) thereon and processed through the following processes. The wafer 1A also includes metallization patterns 131, 132 for interconnection, conductive pads 133 and metal posts 134 formed on the second surface S12 of the wafer 1A through the middle end of line (MEOL) processes and/or back end of line (BEOL) processes of the semiconductor manufacturing processes, but the disclosure is not limited thereto. For example, the metallization patterns 131 and/or 132 may be or include interconnect patterns or layers, the conductive pads 133 may be or include metallic pad such as Al pads, Cu pads, or a suitable die pad, and the metal posts 134 may be or include metal pillars or via posts such as copper or Ni—Au, or a suitable die pillar or via with an UBM structure. The first surface S11 may be referred to as an active surface, and the opposite to the first surface S11 (e.g., the second surface S12A) may be referred to as a backside surface. If a plurality of device regions is formed in the semiconductor base 110, separation and/or isolation structures (e.g., trench isolation structures, sealing rings and/or dicing lines may be formed corresponding to an edge of each device region.

It should be noted that the pattern of the film layer is not limited by the disclosure or a schematic cross-sectional view illustrated in any figure.

Figure 2:
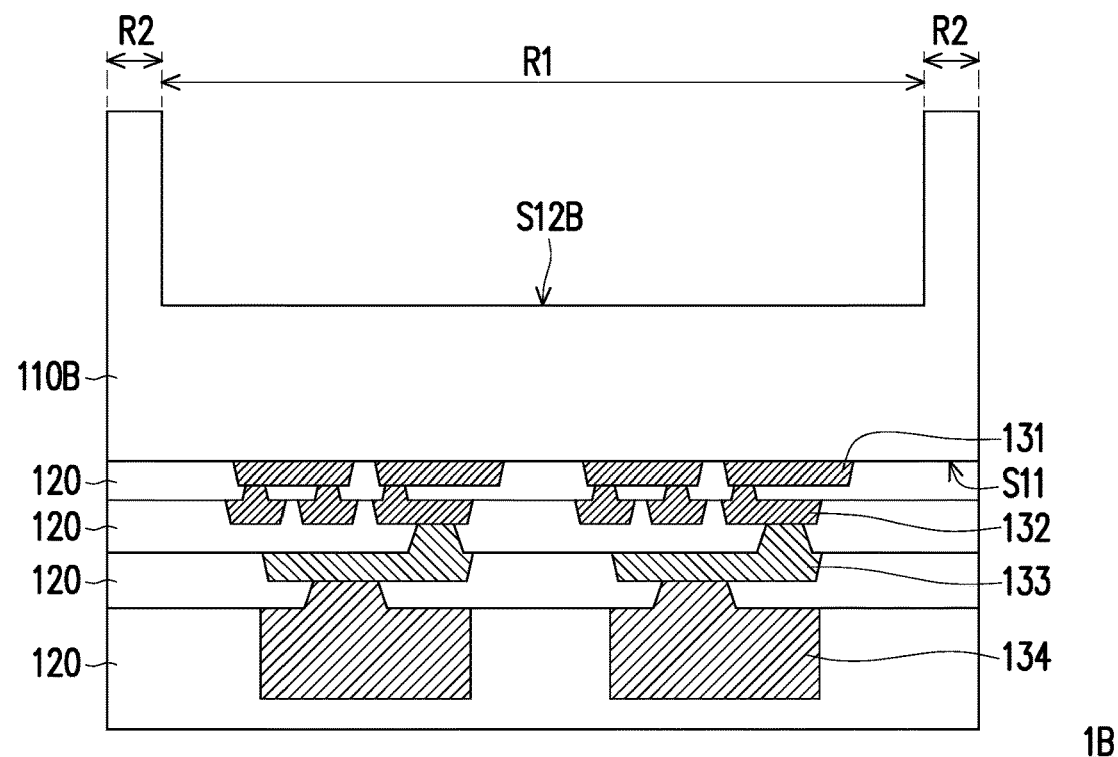

Referring to FIG. 1 to FIG. 2, a back-grinding process may be performed on the second surface S12A of the semiconductor base 110A for forming a semiconductor base 110B having a second surface S12B with a recessed region R1 and an annular protruding region R2 surrounding the recessed region R1. The wafer 1B as shown in FIG. 2 having the recessed region R1 and the corresponding annular protruding region R2 may still be referred to as "a wafer". Moreover, for simplicity, the original element symbols of the wafer and/or corresponding elements still be used. The warpage of the wafer 1B may be reduced by the corresponding annular protruding region R2 during a semiconductor process.

Figure 3:
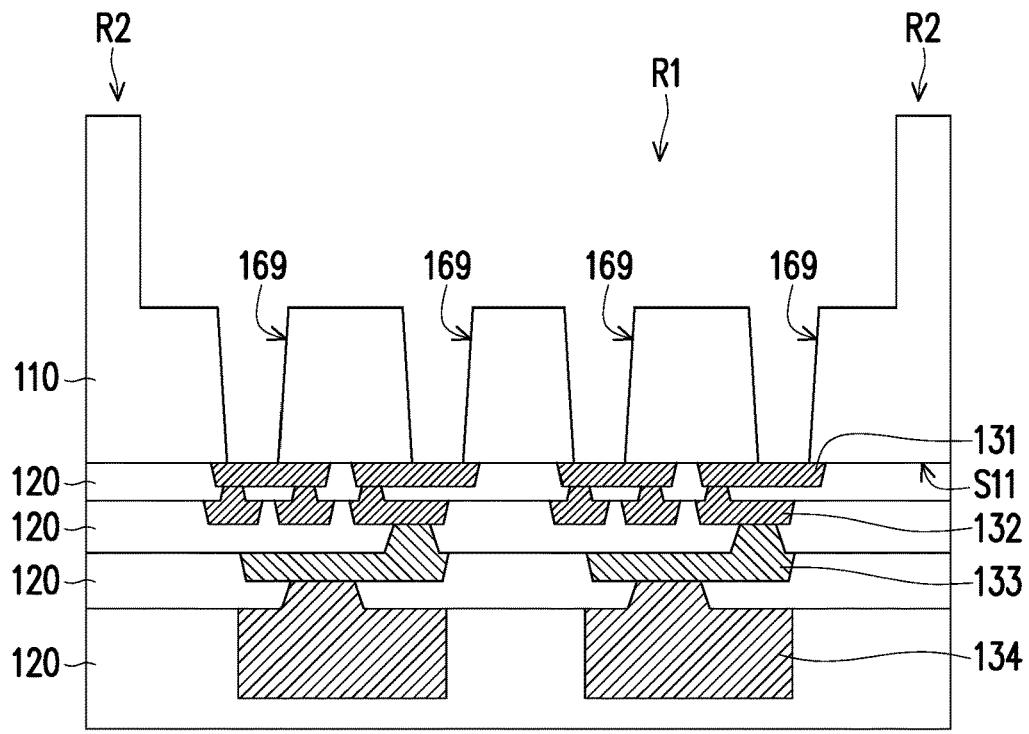
Figure 4:
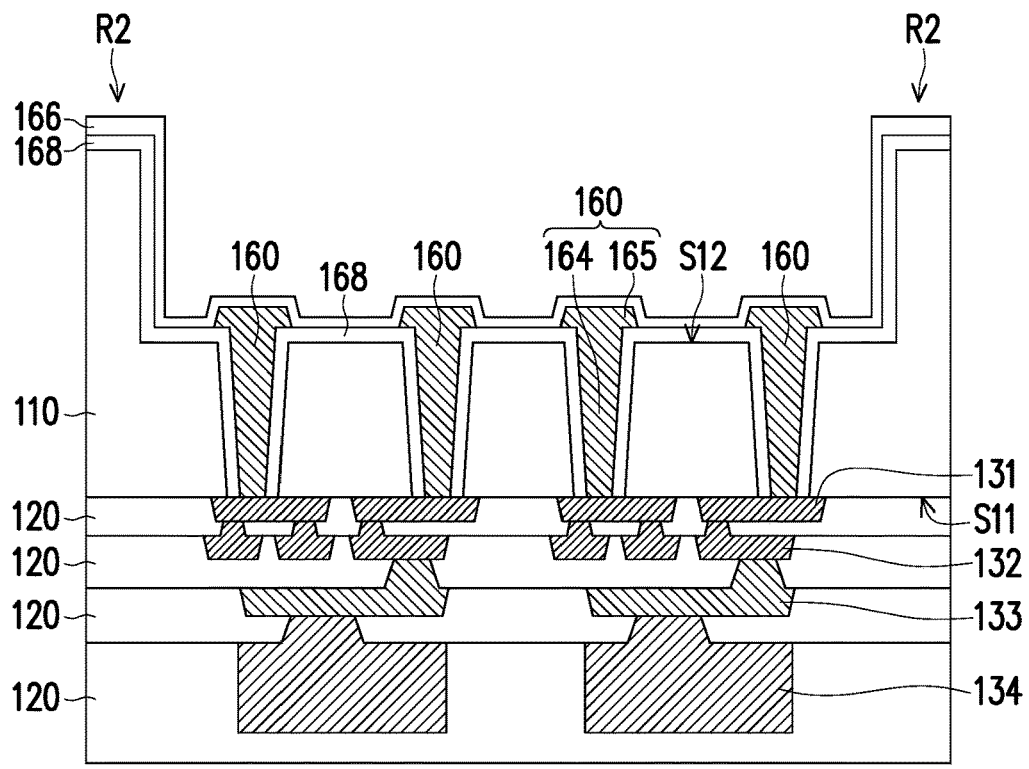
Figure 5:
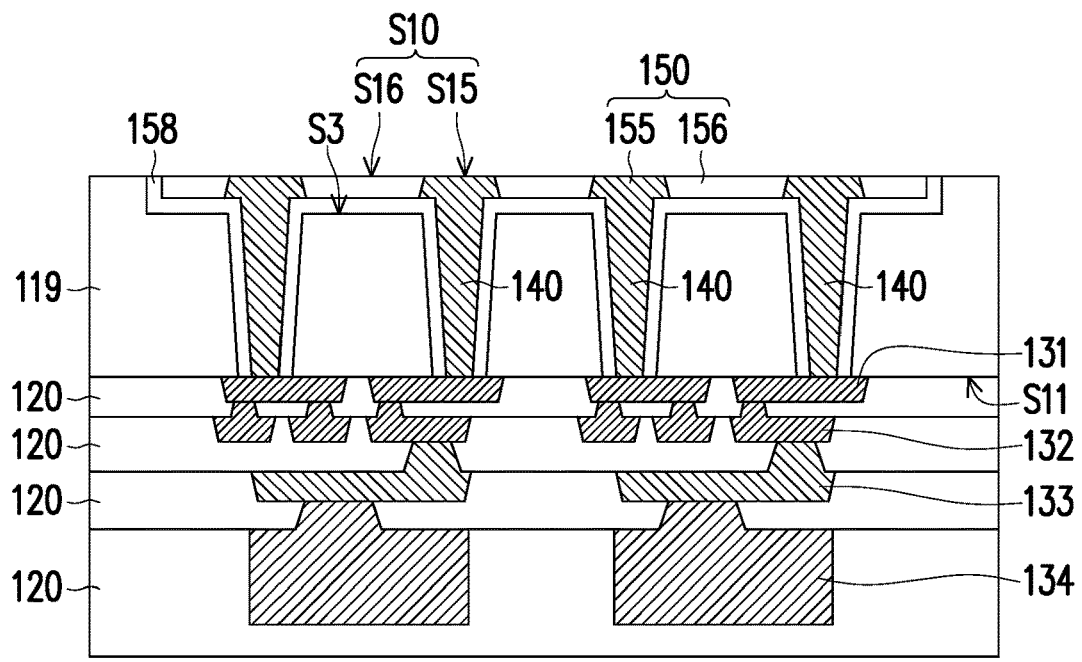

A through silicon structure 140 (labeled in FIG. 5) penetrating through the semiconductor base 119 (labeled in FIG. 5) and a bonding structure 150 (labeled in FIG. 5) formed on the through silicon structure 140 are formed as exemplarily shown in FIG. 3 to FIG. 5.

Referring to FIG. 3, a through hole 169 penetrating through the semiconductor base 110 may be formed by an etching process (e.g., a deep reactive-ion etching (DRIE) process, but the disclosure is not limited thereto) or a drilling process (e.g., a laser drilling process or a mechanical drilling process, but the disclosure is not limited thereto). In an embodiment, the through hole 169 is formed in the recessed region R1. A portion of a conductive layer disposed on the first surface S11 may be exposed by the through hole 169. As shown in FIG. 3, the conductive layer 131 exposed by the through hole 169 may be a portion of the interconnect layer or a suitable circuit layer in the BEOL structure, and it is not limited by the disclosure. In an embodiment not shown, a conductive layer exposed by the through hole 169 may be a conductive pad (e.g., a conductive pad 133).

Referring to FIG. 3 to FIG. 4, a patterned dielectric layer 168 exposing a portion of the conductive layer 131 exposed by the through hole 169 (labeled in FIG. 3) is disposed on the second surface S12 of the semiconductor base 110. The patterned dielectric layer 168 may include a patterned silicon oxide layer, a silicon nitride layer, a silicon oxynitride layer, or a combination thereof.

A conductive material 160 is formed on the patterned dielectric layer 168 and at least filled in the through hole 169 to contact the conductive layer 131 exposed by the patterned dielectric layer 168. The conductive material 160 may include a conductive barrier layer (e.g., a TiN layer, a TaN layer, a Ta layer, or a combination thereof, but the disclosure is not limited thereto), a conductive seed layer (e.g., a PVD Cu layer, but the disclosure is not limited thereto), a plating layer (e.g., an electroplated Cu layer, but the disclosure is not limited thereto), or stacked layers thereof.

A dielectric layer 166 is disposed on a portion of the patterned dielectric layer 168 not covered by the conductive layer 160, or further on the conductive layer 160. A material of the dielectric layer 166 may include a suitable polymer-based dielectric material (e.g., polyimide, epoxy resin, acrylic resin, phenol resin, benzocyclobutene (BCB), polybenzoxazole (PBO), or a combination thereof, but the disclosure is not limited thereto).

Referring to FIG. 4 to FIG. 5, the through silicon structure 140 penetrating through the semiconductor base 119 and the bonding structure 150 are formed. For example, a removing process (e.g., a grinding process and/or a polishing process, but the disclosure is not limited thereto) is performed to remove a portion of the dielectric material 166 (labeled in FIG. 4) for forming a dielectric layer 156 (labeled in FIG. 5) exposing a portion of the conductive material 160 (labeled in FIG. 4). A portion of the conductive material 164 embedded in semiconductor base 119 may be referred as the through silicon structure 140. A portion of the conductive material 165 not embedded in semiconductor base 119 may be referred as a bonding connector 155. That is, the through silicon structure 140 and the bonding connector 155 of the bonding structure 150 may be referred as a same layer (e.g., a portion of the conductive material 160) and/or of a same material. The bonding structure 150 may include the dielectric layer 156 and the bonding connector 155 embedded therein. For improving the yield of an after-mentioned hybrid bonding process, a bonding surface S10 of the bonding structure 150 may be a substantially flat surface. Sometimes, a portion of the conductive material 165 may be further removed during the aforementioned removing process.

In an embodiment, a portion of the semiconductor base 110 (e.g., corresponding to the annular protruding region R2) may be removed during the aforementioned removing process for forming a semiconductor base 119, a portion of the dielectric layer 168 (e.g., a portion of the dielectric layer disposed on the annular protruding region R2) may be removed during the aforementioned removing process for forming a dielectric layer 158, and/or a portion of the dielectric layer 166 (e.g., a portion of the dielectric layer disposed on the annular protruding region R2) may be removed during the aforementioned removing process for forming the dielectric layer 156.

Figure 13:
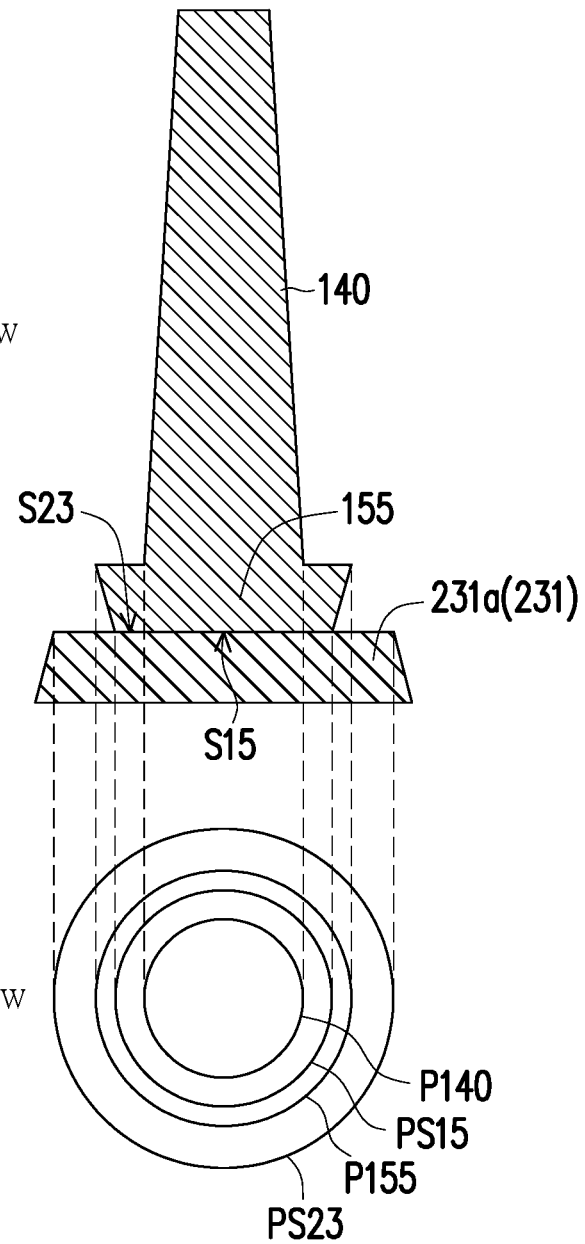
FIG. 13 is a schematic cross-sectional view and a corresponding top view illustrating a package structure in accordance with an embodiment of the disclosure.

In an embodiment, exemplary for improving the process window, as shown in FIG. 13, an area of a projection P155 of the bonding connector 155 on the bonding surface S10 or a surface parallel thereto (e.g., the first surface S11) is larger than an area of a projection P140 of the through silicon structure 140 on the bonding surface S10 or a surface parallel thereto.

In an embodiment, exemplary for improving the process window, as shown in FIG. 13, a span of a projection P140 of the through silicon structure 140 on the bonding surface S10 or a surface parallel thereto (e.g., the first surface S11) is within a span of a projection P155 of the bonding connector 155 on the bonding surface S10 or a surface parallel thereto.

Figure 6:
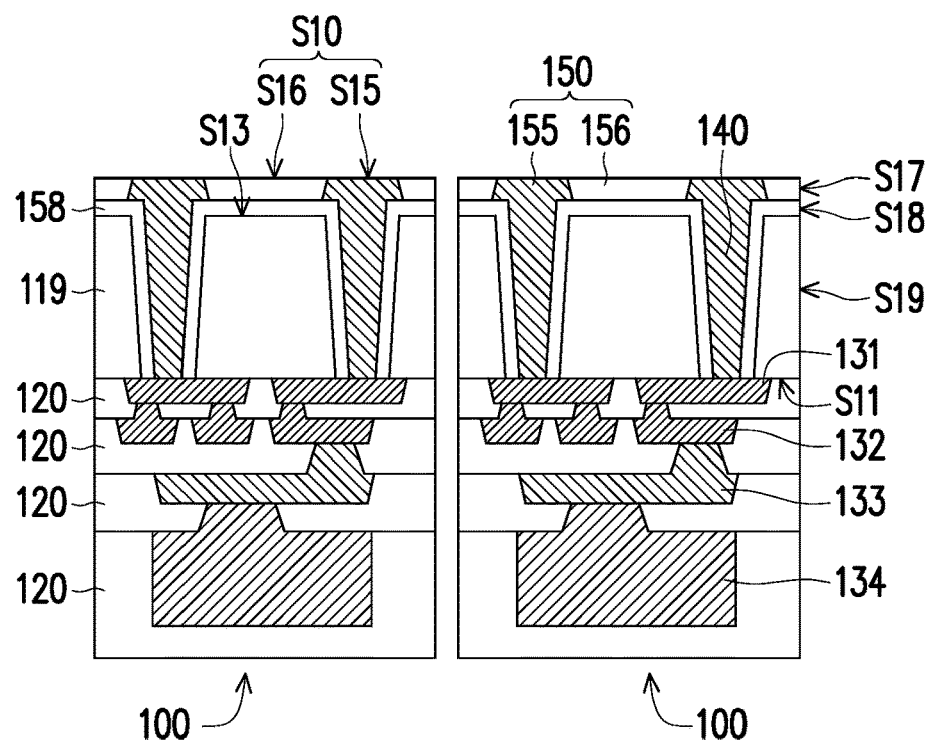

Referring to FIG. 6, a singulation process (e.g., a cutting process and/or a dicing process, but the disclosure is not limited thereto) may be performed on semiconductor base 119 (e.g., along a dicing line) with a through silicon structure 140 formed therein and a bonding structure 150 disposed thereon for forming at least one semiconductor die 100. It should be noted that, after the singulation process is performed, similar element symbols will still be used for the singulated elements. For instance, the semiconductor base 119 (as shown in FIG. 5) may become the semiconductor base 119 (as shown in FIG. 6) after singulation; the through silicon structure 140 (as shown in FIG. 5) may become the through silicon structure 140 (as shown in FIG. 6) after singulation; the bonding structure 150 (as shown in FIG. 5) may become the bonding structure 150 (as shown in FIG. 6) after singulation; and so forth. Other singulated elements will follow the same symbol rules as described above, and will not be repeated or specifically shown herein.

Each semiconductor die 100 includes a corresponding a through silicon structure 140 and a bonding structure 150 disposed on a backside surface S13 of the semiconductor base 119. After the aforementioned singulation process, a side surface S19 of the semiconductor base 119, a side surface S17 of the dielectric layer 156 and a side surface S18 of the dielectric layer 158 may be coplanar.

The through silicon structure 140 may be referred as a through semiconductor via or a through silicon via (TSV). In an embodiment, each through silicon structure 140 has a width of about 0.9 μm to about 10 μm. In an embodiment, two adjacent through silicon structures 140 have a pitch ranging between about 3 μm and about 50 μm.

The semiconductor die 100 may be a semiconductor die capable of performing logical operation function and/or storage function. For example, the semiconductor die 100 may be a Central Process Unit (CPU) dies, a Graphic Process Unit (GPU) dies, a Field-Programmable Gate Array (FPGA), or the like. For example, the semiconductor die 100 may be a Dynamic Random Access Memory (DRAM), a Resistive Random Access Memory (RRAM), a Static Random Access Memory (SRAM), or the like. In an embodiment, the semiconductor die 200 has a height of about 40 μm to about 200 μm.

Figure 7:
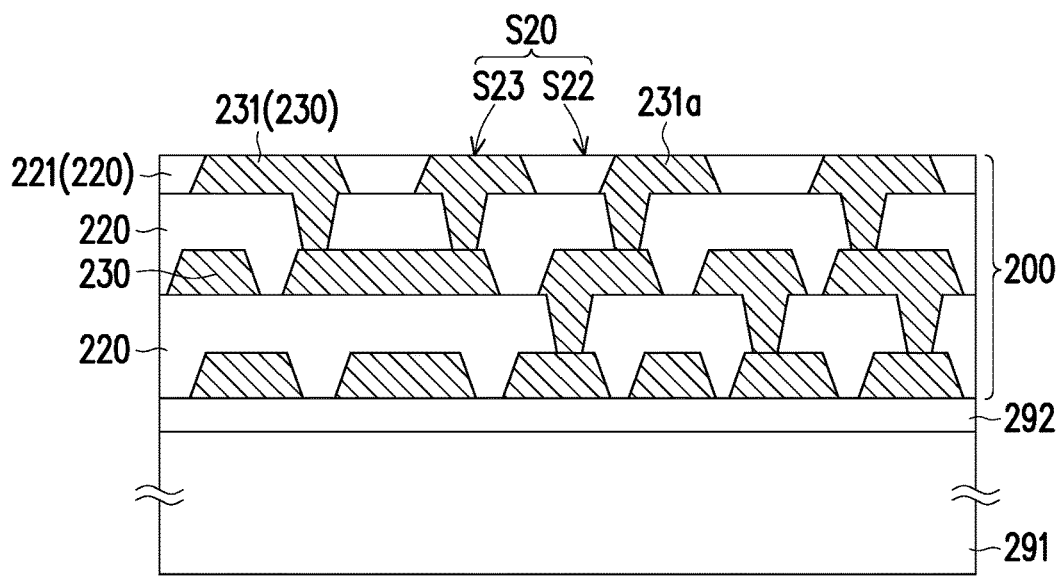

Referring to FIG. 7, a redistribution structure 200 including at least one circuit layer 230 and at least [on] one insulating layer 220 is provided. The redistribution structure 220 may be disposed on a substrate 291 with a release layer (e.g., a light-to-heat-conversion (LTHC) release coating layer, but the disclosure is not limited thereto) 292 thereon and formed by a semiconductor process.

For improving the yield of an after-mentioned hybrid bonding process, a bonding surface S20 of the redistribution structure 200 may be a substantially flat surface performed by a flatting process (e.g., a grinding process, a polishing process (e.g., a CMP process), or a suitable flatting process, but the disclosure is not limited thereto). The bonding surface S20 includes an outer surface S23 of the topmost circuit layer (the circuit layer 230 farthest from the substrate 291) 231 and an outer surface S22 of the topmost insulating layer (the insulating layer 220 farthest from the substrate 291) 221. A material of the topmost insulating layer 221 may include a suitable polymer-based dielectric material (e.g., polyimide, epoxy resin, acrylic resin, phenol resin, benzocyclobutene (BCB), polybenzoxazole (PBO), or a combination thereof, but the disclosure is not limited thereto).

Figure 8:
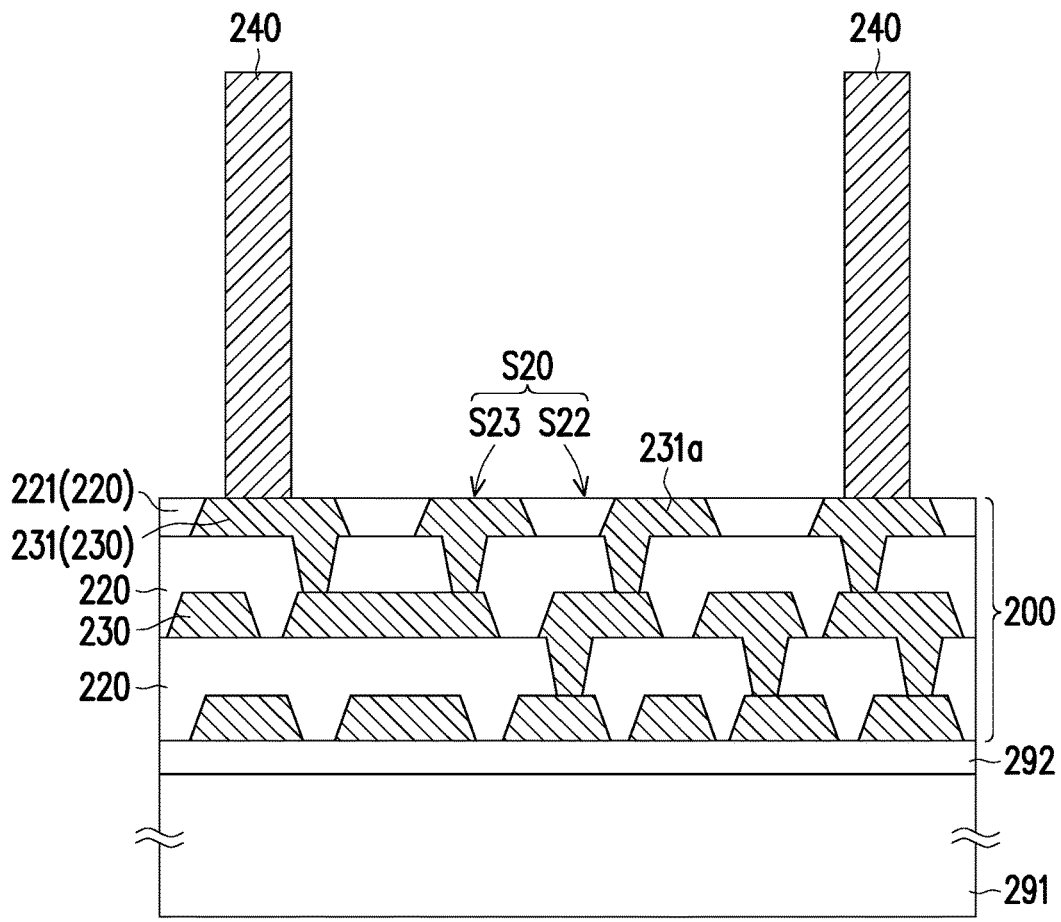

Referring to FIG. 8, a connector 240 may be formed on the redistribution structure 220 by a semiconductor process (e.g., photolithography and etching process, deposition process, and/or plating process; or, wire bonding process and cutting process, but the disclosure is not limited thereto) for electrically connecting to a circuit layer 230. In an embodiment, the connector 240 may be connected to a portion of the topmost circuit layer 231. In an embodiment not shown, a connector structurally similar to the connector 240 may be formed after an after-mentioned molding process or spin-coating process.

Figure 9:
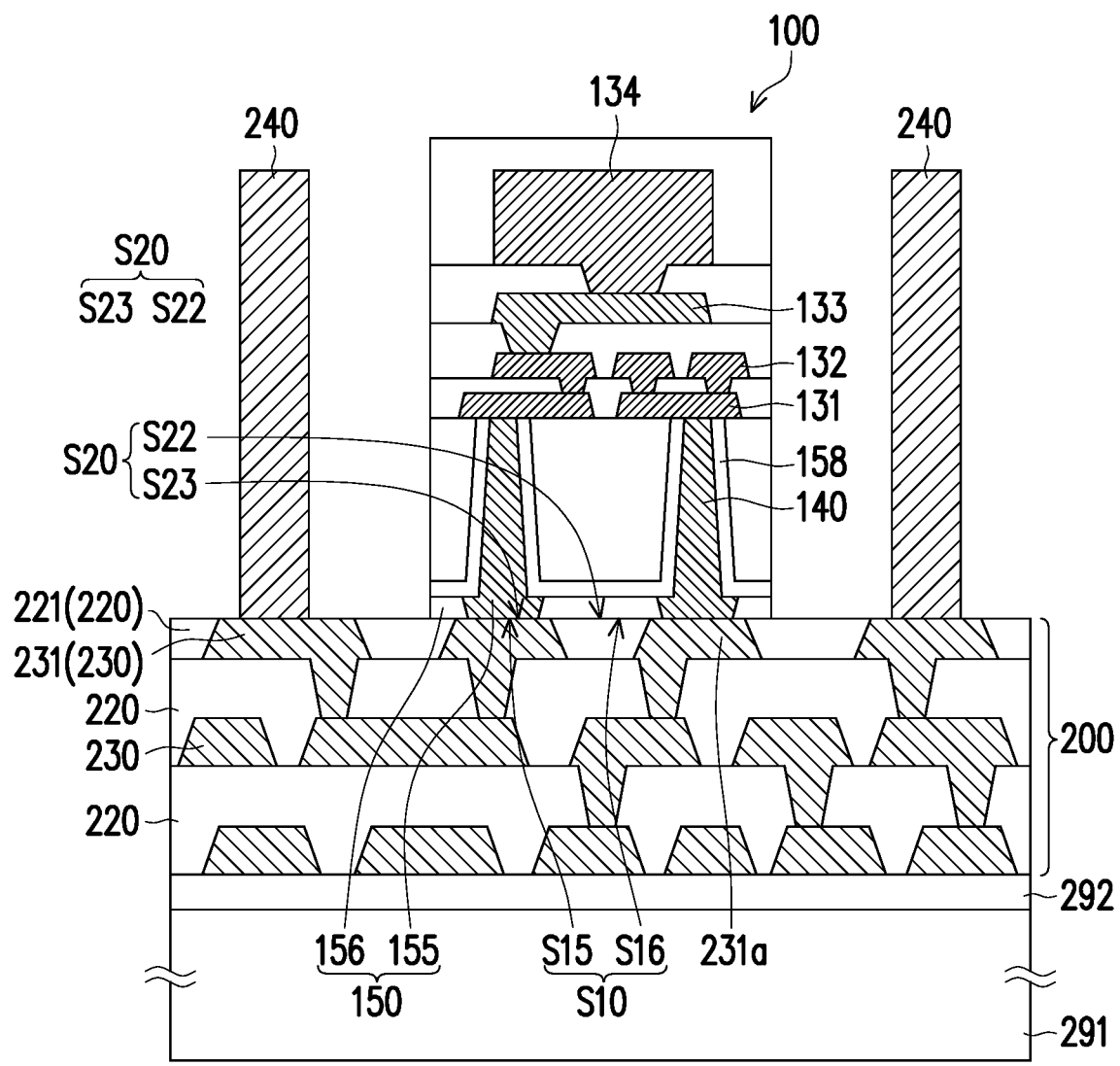

Referring to FIGS. 6 and 8 to FIG. 9, the dielectric layer 156 of the bonding structure 150 and the topmost insulating layer 221 of the redistribution structure 200 are bonded with each other, and the bonding connector 155 of the bonding structure 150 and a bonding pad 231a of the topmost circuit layer 231 of the redistribution structure 200 are bonded with each other. In an embodiment, the aforementioned bonding process may be referred as hybrid bonding process.

In an embodiment, one bonding connector 155 and one bonding pad 231a of the corresponding topmost circuit layer 231 directly contacted thereof consist one connection pair. Exemplary for improving the process window (e.g., a process window for alignment process), as shown in FIG. 13, a span of a projection P155 of the bonding surface S15 of the bonding connector 155 of aforementioned connection pair or a surface parallel thereto (e.g., the first surface S11) is within a span of a projection PS23 of the bonding surface S23 of the bonding pad 231a of the topmost circuit layer 231 of aforementioned connection pair.

For example, the semiconductor die 100 may be disposed on the redistribution structure 200 in a manner of the bonding surface S10 of the bonding structure 150 facing the bonding surface S20 of the redistribution structure 200. The dielectric layer 156 of the bonding structure 150 may be close to, and even touch, the topmost insulating layer 221 of the redistribution structure 200; and, the bonding connector of 155 the bonding structure 150 may be close to, and even touch, the topmost circuit layer 231 of the redistribution structure 200. Then, the redistribution structure 200 and the semiconductor die 100 disposed thereon may be disposed in an environment ranging from about 150° C. to about 400° C. As such, the dielectric layer 156 and the topmost insulating layer 221 may be bonded or contacted with each other, and the bonding connector 155 and the topmost circuit layer 231 may be bonded or contacted with each other.

In an embodiment, to facilitate the hybrid bonding between the bonding structure 150 and the redistribution structure 200, surface preparation for a bonding surface (e.g., the bonding surface S10 of the bonding structure 150 and/or the bonding surface S20 of the redistribution structure 200) may be performed. The surface preparation may include a surface cleaning step and/or an activation step, for example. The surface cleaning step may be performed on the bonding surface S10 and/or S20 to remove particles thereon. In an embodiment, the bonding surface S10 and/or S20 may be cleaned by wet cleaning and/or clean dry non-reactive gas (e.g., pure nitrogen gas, pure argon gas, or a mixture gas thereof, but the disclosure is not limited thereto) purge, for example. Not only particles are removed, but also native oxide formed on the bonding surface S15 of the bonding connector 155 and/or the bonding surface S23 of the topmost circuit layer 231 may be removed. The native oxide formed on the bonding surface S15 of the bonding connector 155 and/or the bonding surface S23 of the topmost circuit layer 231 may be removed by chemicals used in wet etching and cleaning processes, or further, in clean dry non-reactive gas purge, for example.

After cleaning the bonding surface S10 of the bonding structure 150 and/or the bonding surface S20 of the redistribution structure 200, activation of the bonding surface S16 of the dielectric layer 156 and/or the bonding surface S22 of the topmost insulating layer 221 may be performed for development of high bonding strength. In an embodiment, plasma activation may be performed to treat the bonding surface S16 of the dielectric layer 156 and/or the bonding surface S22 of the topmost insulating layer 221. After the activation step, the bonding surface S10 of the bonding structure 150 and the bonding surface S20 of the redistribution structure 200 could be in contact with each other. That is, the bonding structure 150 and the redistribution structure 200 are pre-bonded After pre-bonding the bonding structure 150 onto the redistribution structure 200, hybrid bonding of the bonding structure 150 and the redistribution structure 200 is performed. The hybrid bonding process of the bonding structure 150 and the redistribution structure 200 may include a thermal treatment for dielectric bonding and a thermal annealing for conductor bonding. The dielectric layer 156 and the topmost insulating layer 221 may be heated to a temperature above their softening point or glass transition (Tg) point. During the process in which the dielectric layer 156 and the topmost insulating layer 221 are softened, the bonding connector 155 and the topmost circuit layer 231 could be in contact with each other. In an embodiment, the thermal treatment for dielectric bonding is performed to strengthen the bonding between the dielectric layer 156 and the topmost insulating layer 221. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding connector 155 and the topmost circuit layer 231. For example, the thermal annealing for conductor bonding may be performed at temperature ranging from about 150° C. to about 400° C. After performing the thermal annealing for conductor bonding, the dielectric layer 156 is hybrid bonded to the topmost insulating layer 221, and the bonding connector 155 is hybrid bonded to the topmost circuit layer 231. For example, the dielectric layer 156 is directly in contact with the topmost insulating layer 221. Similarly, the bonding connector is 155 directly in contact with the topmost circuit layer 231. That is, after the hybrid bonding process, there may be no space between the bonding structure 150 and the redistribution structure 200. As such, the bonding structure 150 is hybrid bonded to the redistribution structure 200.

It should be noted that in the exemplary embodiment as shown in FIGS. 7 to 9, the connector 240 is formed on the redistribution structure 200; then, the bonding structure 150 is hybrid bonded to the redistribution structure 200. In a similar embodiment, the bonding structure 150 is hybrid bonded to the redistribution structure 200; then, a connector structurally similar to the connector 240 is formed on the redistribution structure 200.

Figure 10:
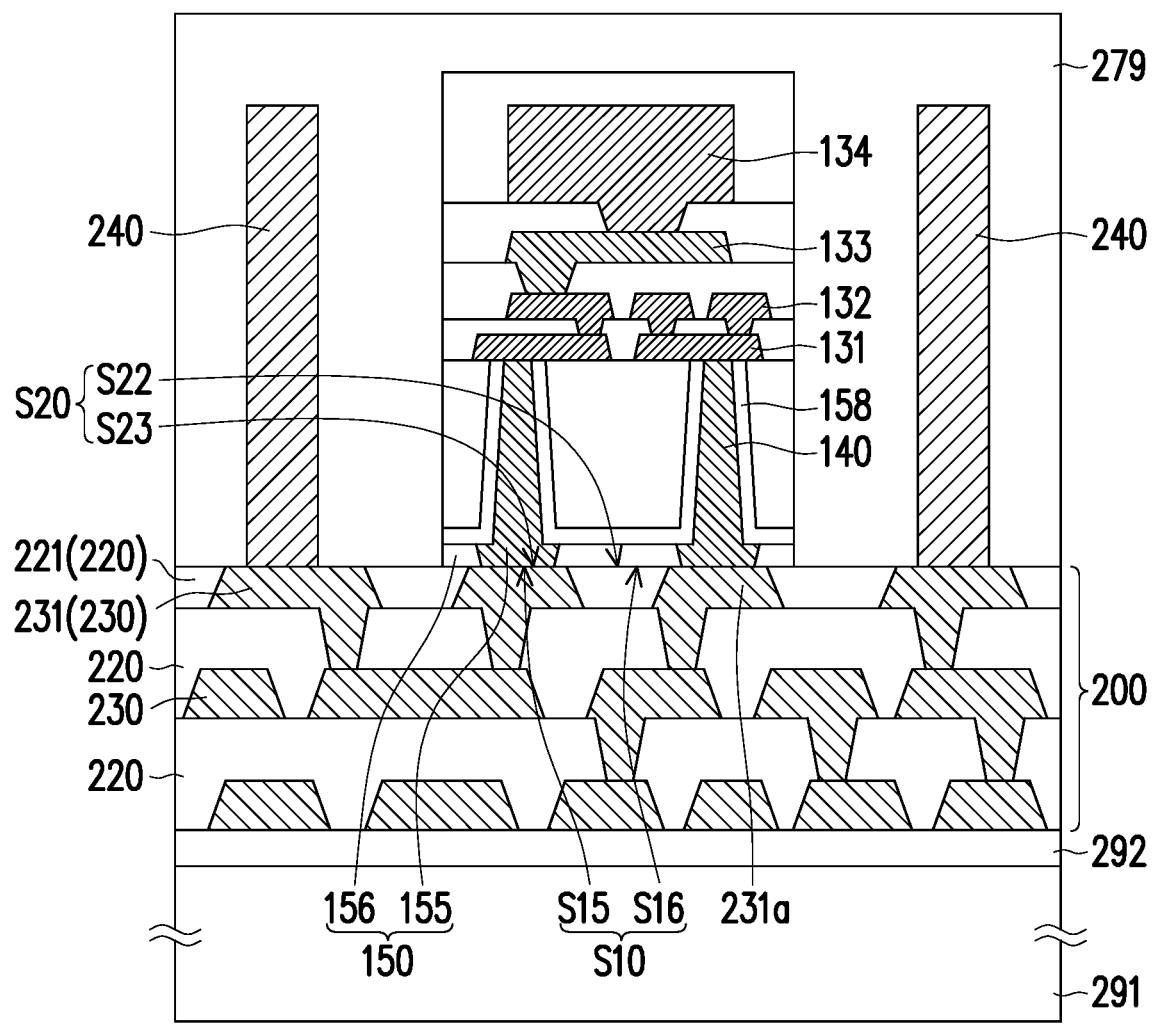
Figure 11:
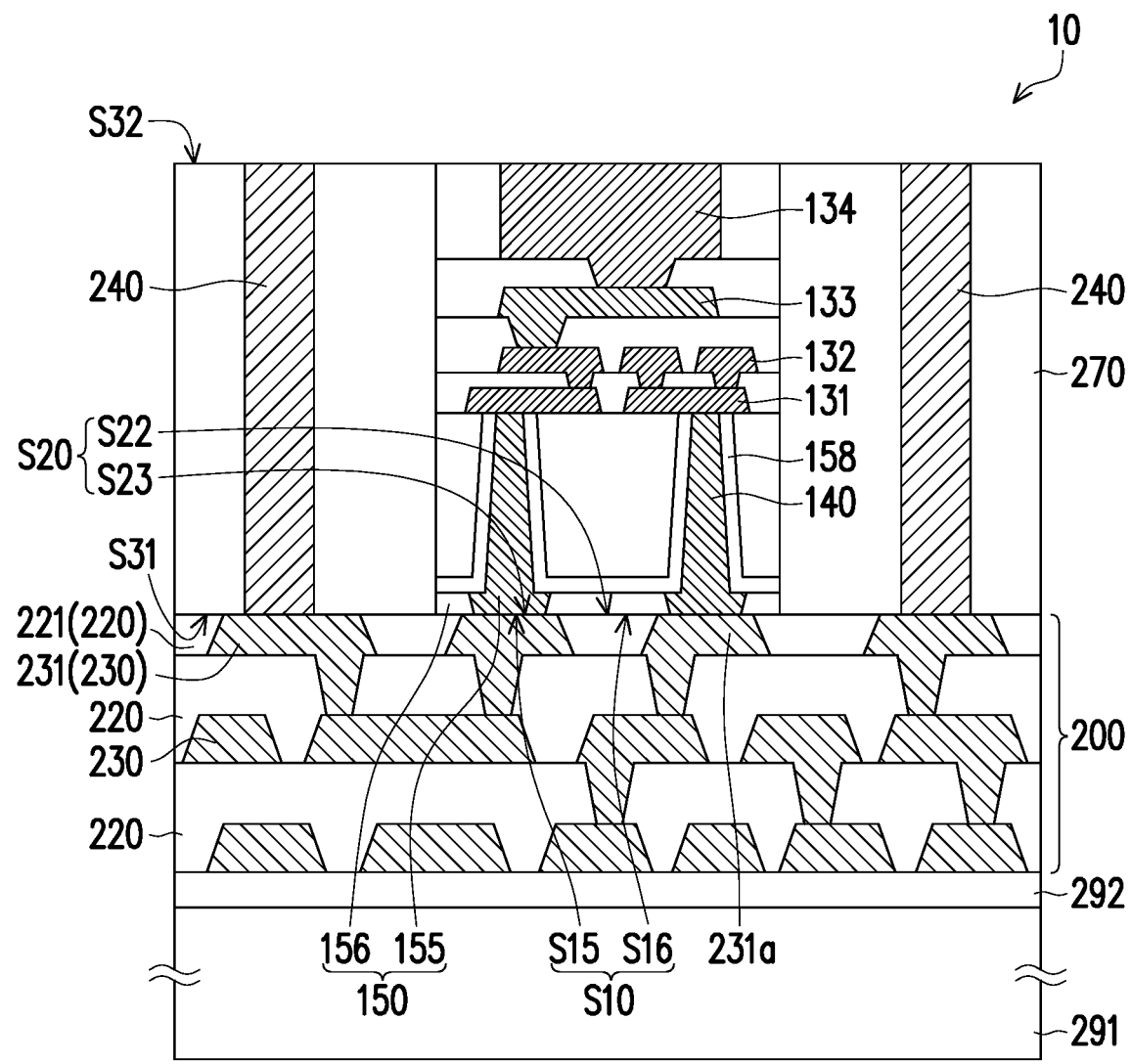

Referring to FIG. 9 to FIG. 11, after the bonding structure 150 is hybrid bonded to the redistribution structure 200, an encapsulant 270 (labeled in FIG. 11) may be formed on the redistribution structure 200 by a molding process (e.g., a compression molding process) or a spin-coating process.

For example, referring to FIG. 9 to FIG. 10, a molding compound (e.g., epoxy resin or other suitable polymer-based dielectric material) 279 may be formed and cured on the redistribution structure 200. Then, referring to FIG. 10 to FIG. 11, a removing process (e.g., a grinding process and/or a polishing process) is performed to remove a portion of the cured molding compound 279 (labeled in FIG. 10) for forming the encapsulant 270 (labeled in FIG. 10) and exposing the conductive layer 134 of the semiconductor die 100. The encapsulant 270 may laterally cover the semiconductor die 100.

In an embodiment, the connector 240 may be exposed by the removing process of removing a portion of the cured molding compound. That is, the connector 240 embedded in and/or penetrates the encapsulant 270 may be referred as a through molding via (TMV) or a through insulator via (TIV).

In an embodiment not shown, a connector similar to the connector 240 may be formed after the polymer-based dielectric material is formed on the redistribution structure 200. For example, a removing process (e.g., an etching process or a drilling process) may be performed on the polymer-based dielectric material for forming a through hole exposed a portion of the circuit layer 230 (e.g., the topmost circuit layer 231) of the redistribution structure 200; then, a conductive material may be filled in the through hole for forming the connector structurally similar to the connector 240. That is, the connector structurally similar to the connector 240 may be also referred as a through molding via (TMV) or a through insulator via (TIV).

In an embodiment, the substrate 291 may be removed by peeling off the release layer 292 after forming the encapsulant 270.

A package structure 10 of an embodiment may be formed by the above manufacturing process. A device located in the device region on the active surface S11 of the semiconductor die 100 could be electrically connected to a corresponding circuit layer 230 through the through silicon structure 140. Moreover, when the semiconductor die 100 is in operation, heat generated by the device region could also be transferred to the circuit layer 230 through the through silicon structure 140 for improving the heat dissipation capability of the package structure 10 and/or a package structure similar thereto.

Figure 12:
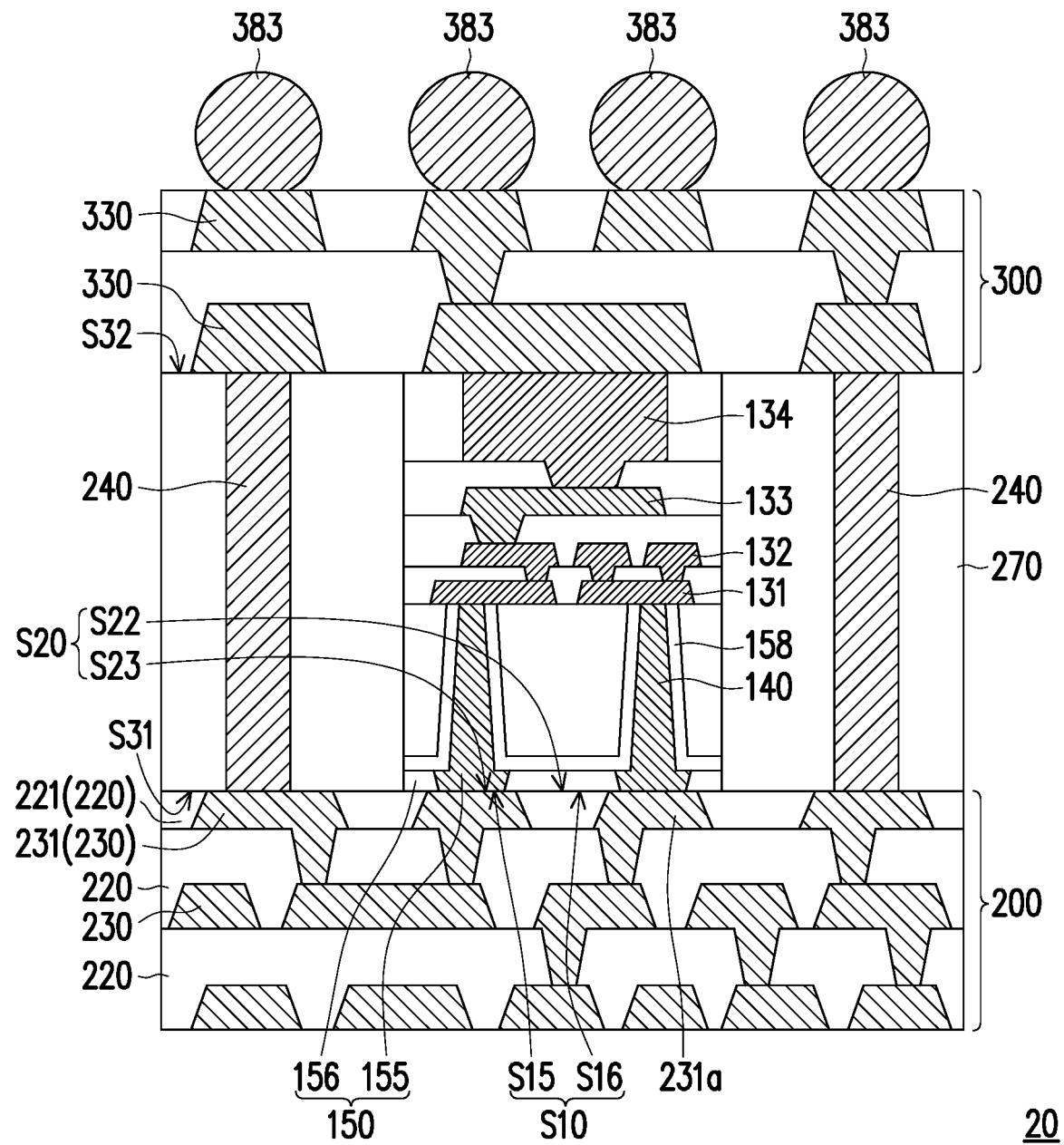

Referring to FIG. 11 to FIG. 12, a redistribution structure 300 may be formed on the encapsulant 270 opposite to the redistribution structure 200 by a semiconductor process. For example, the encapsulant 270 has a first encapsulation surface S31 and a second encapsulation surface S32 opposite the first encapsulation surface S31. The redistribution structure 200 is disposed on the first encapsulation surface S31, and the redistribution structure 300 is disposed on the second encapsulation surface S32.

In an embodiment, the bonding surface S10 of the semiconductor die 100, a surface of the connector 240, the first encapsulation surface S31 of the encapsulant 270, and the bonding surface S20 of the first redistribution structure 200 are coplanar.

The conductive layer 134 of the semiconductor die and/or the connector 240 may electrically connect to a corresponding circuit layer 330 of the redistribution structure 300.

A terminal connector 383 may be formed on the redistribution structure 300. The terminal connector 383 may electrically connect to a corresponding circuit layer 300 of the redistribution structure 300. The terminal connector 383 may be, for example, a solder ball, a ball grid array (BGA) ball, or a controlled collapse chip connection (C4) bump.

A package structure 20 of an embodiment may be formed by the above manufacturing process. In an embodiment, the package 20 may be utilized in flip-chip applications. For example, the package 20 may be further bonded onto a substrate, such as a printed circuit board (PCB), an interposer or the like, in a flip-chip manner.

Figure 14:
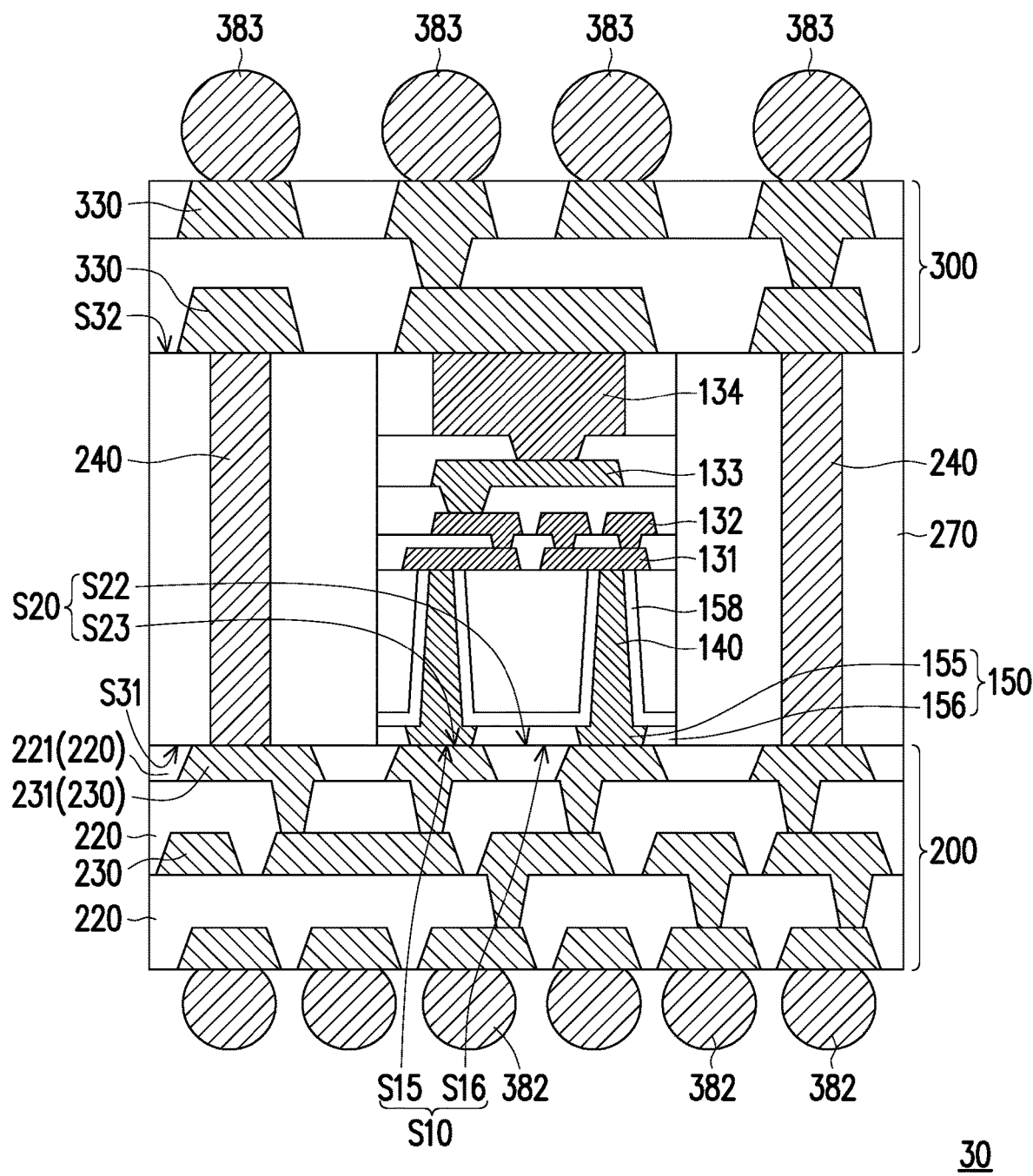
FIG. 14 is a schematic cross-sectional view illustrating a package structure in accordance with an embodiment of the disclosure.

In an embodiment as shown in FIG. 14, a terminal connector 382 structurally similar to the terminal connector 383 may be formed on the redistribution structure 200. The terminal connector 382 may electrically connect to a corresponding circuit layer 230 of the redistribution structure 200.

A package structure 30 of an embodiment may be formed by the above manufacturing process. In an embodiment, the package 30 may be utilized in flip-chip applications. For example, the package 30 may be further bonded onto a substrate, such as a printed circuit board (PCB), an interposer or the like.

Figure 15:
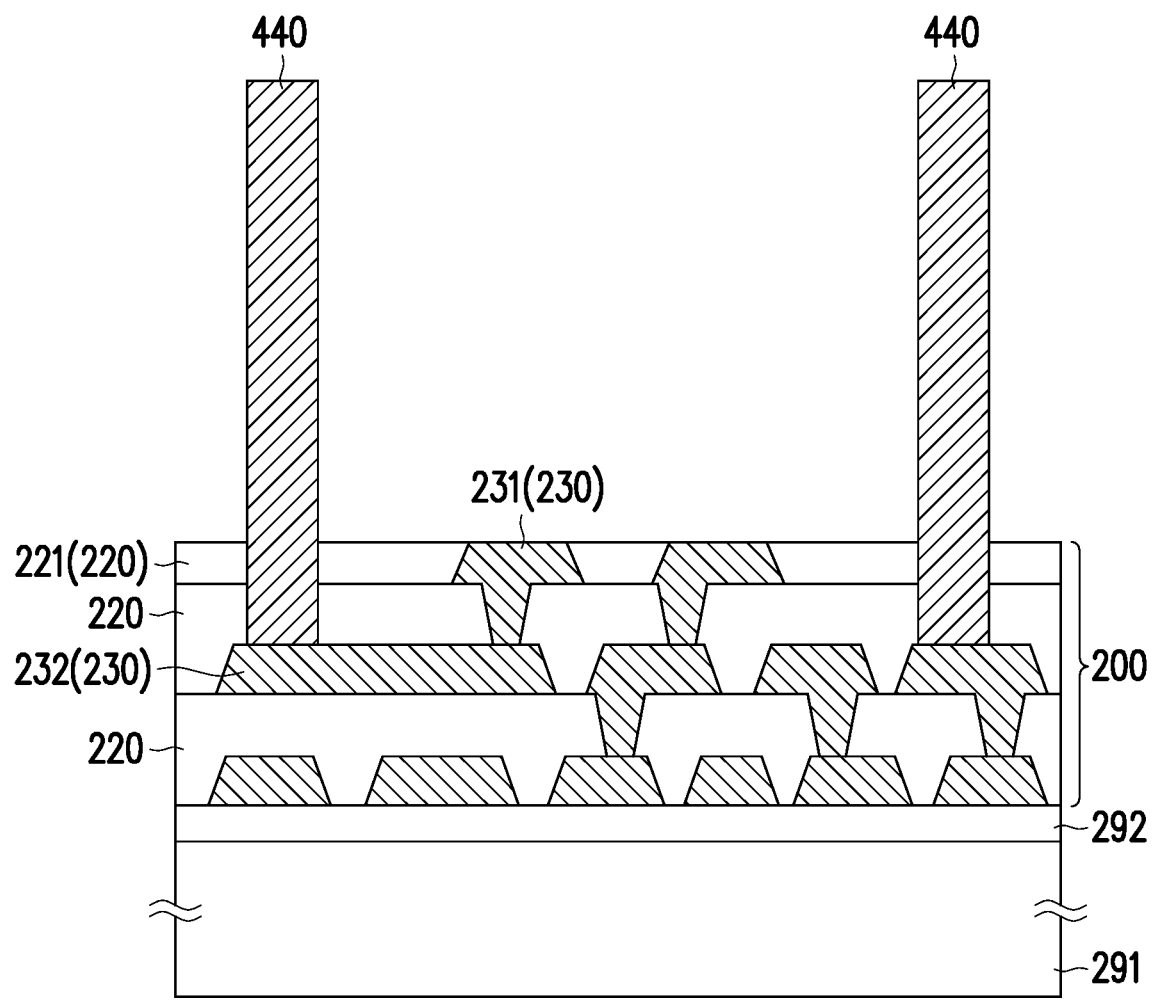
FIG. 15 to FIG. 16 are schematic cross-sectional views illustrating a package structure in accordance with an alternative embodiment of the disclosure.
Figure 16:
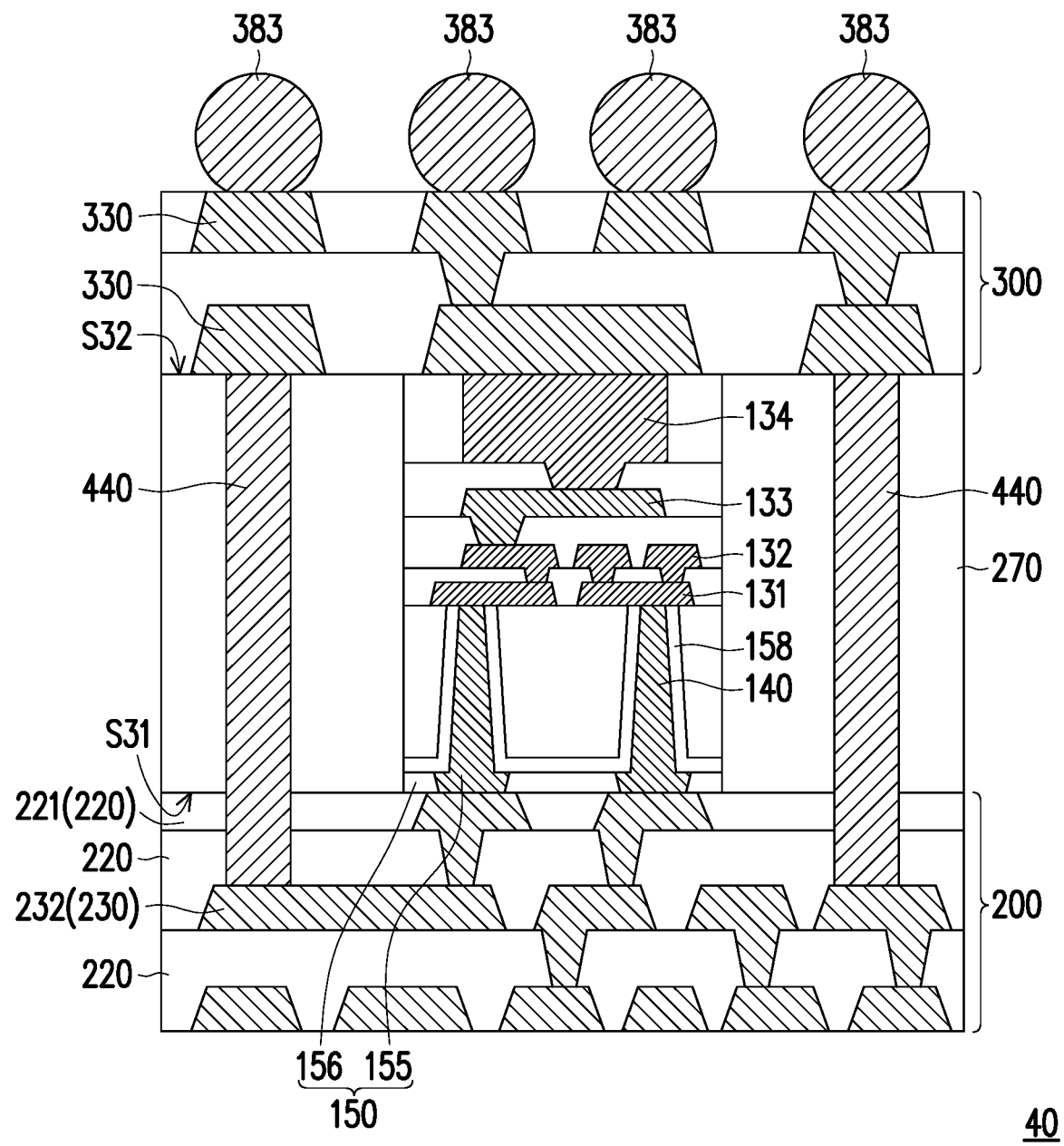

FIG. 15 to FIG. 16 are schematic cross-sectional views illustrating a package structure in accordance with an alternative embodiment of the disclosure.

In an embodiment, the connector 440 penetrates at least the topmost insulating layer 221 to be in contact with an inner circuit layer 232.

For example, before forming the connector 440, a removing process (e.g., an etching process or a drilling process) may be performed for exposing a portion of the inner circuit layer 232. Then, the connector 440 may be formed on the redistribution structure 220 by a semiconductor process (e.g., photolithography and etching process, deposition process, and/or plating process; or, wire bonding process and cutting process, but the disclosure is not limited thereto) for connecting to the portion of the inner circuit layer 232 exposed from topmost insulating layer 221. That is, the connector 440 is embedded in the redistribution structure 200.

In an embodiment, the bonding surface S10 of the semiconductor die 100, the first encapsulation surface S31 of the encapsulant 270, and the bonding surface S20 of the first redistribution structure 200 are coplanar.

Referring to FIGS. 6 and 15 to FIG. 16, a package structure 40 of an embodiment may be formed by a manufacturing process similar to that as shown in FIGS. 9 to 12.

For example, referring to FIGS. 6 and 15, the dielectric layer 156 of the bonding structure 150 and the topmost insulating layer 221 of the redistribution structure 200 are bonded with each other, and the bonding connector 156 of the bonding structure 150 and the topmost circuit layer 231 of the redistribution structure 200 are bonded with each other. Then, similar the process as shown in FIG. 11, after the bonding structure 150 is hybrid bonded to the redistribution structure 200, an encapsulant 270 (labeled in FIG. 11) may be formed on the redistribution structure 200.

A package structure 40 of an embodiment may be formed by the above manufacturing process. In an embodiment, a redistribution structure 300 may be formed on the encapsulant 270 opposite to the redistribution structure 200 by a semiconductor process.

In an embodiment not shown, a terminal connector structurally similar to the terminal connector 382 may be formed on the redistribution structure 200.

As above, a package structure at least includes a semiconductor die and a redistribution structure disposed thereon. The semiconductor die includes a through silicon structure and a bonding structure disposed on the backside surface of the die. A device located in the device region on the active surface of the semiconductor die could be electrically connected to a corresponding circuit layer of the redistribution structure through the through silicon structure. When the semiconductor die is in operation, heat generated by the device region could be transferred to the circuit layer through the through silicon structure for improving the heat dissipation capability of the package structure.

In accordance with an embodiment of the disclosure, a package structure includes a semiconductor die, an encapsulant, a first redistribution structure, and a through insulating via. The semiconductor die has through semiconductor vias and a bonding structure. The bonding structure is disposed on a backside surface of the semiconductor die. The bonding structure includes a first dielectric layer and bonding connectors embedded in the first dielectric layer. The through semiconductor vias connected to the bonding connectors. The encapsulant laterally encapsulates the semiconductor die. The first redistribution structure is disposed on a first surface of the encapsulant and connected with the semiconductor die. The first redistribution structure includes an insulating layer and circuit layers embedded in the insulating layer. The first dielectric layer of the bonding structure of the semiconductor die is bonded with the insulating layer of the first redistribution structure. The bonding connectors of the bonding structure of the semiconductor die are bonded with bonding pads of the circuit layers of the first redistribution structure. The through insulating via penetrates through the encapsulant and is electrically connected to the circuit layers of the first redistribution structure.

In accordance with an embodiment of the disclosure, a package structure includes a first redistribution structure, a semiconductor die, and an encapsulant. The first redistribution structure includes an insulating layer and circuit layers. The semiconductor die is disposed on the first redistribution structure. The semiconductor die includes a semiconductor base, through semiconductor vias, a dielectric layer, and bonding connectors. Through semiconductor vias penetrate through the semiconductor base. The dielectric layer is disposed on a backside of the semiconductor base. The dielectric layer of the semiconductor die is bonded with the insulating layer of the first redistribution structure. The bonding connectors are embedded in the dielectric layer and connected to the through semiconductor vias. The bonding connectors of the semiconductor die are bonded with bonding pads of the circuit layers. The encapsulant is disposed on the first redistribution structure and encapsulates the semiconductor die.

In accordance with an embodiment of the disclosure, a manufacturing method of a package structure includes at least the following steps. A wafer is provided. Through semiconductor vias penetrating through the wafer and a bonding structure formed thereon are formed. The wafer is diced for forming at least one semiconductor die having the through semiconductor vias and the bonding structure. The bonding structure includes a dielectric layer and bonding connectors embedded in the dielectric layer. A redistribution structure including an insulating layer and a circuit layer is provided. The dielectric layer and the bonding connectors are bonding with the insulating layer and the circuit layer respectively. An encapsulant and a through insulating via are formed on the redistribution structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die having through semiconductor vias and a bonding structure disposed on a backside surface of the semiconductor die, wherein the bonding structure comprises: a first dielectric layer and bonding connectors embedded in the first dielectric layer, and wherein the through semiconductor vias connect to the bonding connectors;
   an encapsulant laterally encapsulating the semiconductor die;
   a first redistribution structure disposed on a first surface of the encapsulant and connected with the semiconductor die, wherein the first redistribution structure comprises: an insulating layer and circuit layers embedded in the insulating layer, wherein the first dielectric layer of the bonding structure of the semiconductor die is bonded with the insulating layer, and wherein the bonding connectors of the bonding structure of the semiconductor die are bonded with bonding pads of the circuit layers; and
   a through insulating via penetrating through the encapsulant and being electrically connected to the circuit layers of the first redistribution structure, wherein the semiconductor die comprises: a semiconductor base and a second dielectric layer covering the semiconductor base, wherein the through semiconductor vias penetrate through the semiconductor base, and wherein the second dielectric layer is disposed between the semiconductor base and the through semiconductor vias and between the first dielectric layer and the semiconductor base.

2. The package structure according to claim 1, further comprising:
   a second redistribution structure disposed on a second surface of the encapsulant opposite to the first surface and electrically connected with the first redistribution structure through the through insulating via; and terminal connectors disposed on the second redistribution structure.

3. The package structure according to claim 1, wherein the bonding connectors and the through semiconductor vias are of a same material.

4. The package structure according to claim 1, wherein a projected area of the bonding connector on the backside surface of the semiconductor die is larger than a projected area of the through semiconductor via on the backside surface of the semiconductor die.

5. The package structure according to claim 1, wherein a span of a projection of one of the through semiconductor vias on the backside surface of the semiconductor die is within a span of a projection of one of the bonding connectors on the backside surface of the semiconductor die.

6. The package structure according to claim 1, wherein the first dielectric layer of the bonding structure of the semiconductor die is directly in contact with the insulating layer, and the bonding connectors of the bonding structure of the semiconductor die are directly in contact with the bonding pads of the circuit layers.

7. The package structure according to claim 1, wherein a side surface of the semiconductor base, a side surface of the first dielectric layer and a side surface of the second dielectric layer are coplanar and vertically aligned.

8. The package structure according to claim 1, wherein the second dielectric layer is in direct contact with the encapsulant.

9. The package structure according to claim 1, wherein the semiconductor die is electrically connected with the first redistribution structure through the bonding connectors and the bonding pads.

10. A package structure, comprising:
a first redistribution structure comprising an insulating layer and circuit layers;
a semiconductor die disposed on the first redistribution structure and comprising:
a semiconductor base;
through semiconductor vias penetrating through the semiconductor base;
a first dielectric layer disposed on a backside of the semiconductor base, wherein the first dielectric layer is bonded with the insulating layer of the first redistribution structure; and
bonding connectors embedded in the first dielectric layer and connected to the through semiconductor vias, wherein the bonding connectors are bonded with bonding pads of the circuit layers; and
an encapsulant disposed on the first redistribution structure and encapsulating the semiconductor die, wherein the semiconductor die further comprises a second dielectric layer covering the semiconductor base, wherein the through semiconductor vias penetrate through the semiconductor base, and wherein the second dielectric layer is disposed between the semiconductor base and the through semiconductor vias and between the first dielectric layer and the semiconductor base.

11. The package structure according to claim 10, wherein a surface of the first dielectric layer, surfaces of the bonding connectors, a surface of the encapsulant and a surface of the first redistribution structure are coplanar.

12. The package structure according to claim 10, further comprising:

a second redistribution structure, wherein the semiconductor die or the encapsulant is disposed between the first redistribution structure and the second redistribution structure; and
a through insulating via penetrating through the encapsulant and being electrically connected to the first redistribution structure and the second redistribution structure.

13. The package structure according to claim 12, wherein the through insulating via is further embedded in the first redistribution structure.

14. The package structure according to claim 12, wherein a surface of the semiconductor die, a surface of the through insulating via, a surface of the encapsulant and a surface of the first redistribution structure are coplanar.

15. The package structure according to claim 12, further comprising:
a terminal connector disposed on the first redistribution structure or the second redistribution structure.

16. The package structure according to claim 10, wherein the encapsulant laterally encapsulates the semiconductor die.

17. A manufacturing method of a package structure, comprising:
providing a wafer;
forming through semiconductor vias penetrating through the wafer and a bonding structure formed thereon;
dicing the wafer for forming at least one semiconductor die having the through semiconductor vias and the bonding structure, wherein the bonding structure comprises a dielectric layer and bonding connectors embedded in the dielectric layer;
providing a redistribution structure, wherein the redistribution structure comprises an insulating layer and a circuit layer;
bonding the dielectric layer and the bonding connectors with the insulating layer and the circuit layer respectively; and
forming an encapsulant and a through insulating via on the redistribution structure.

18. The manufacturing method of the package structure according to claim 17, wherein the step of forming the through semiconductor vias and the bonding structure comprising:
forming through holes penetrating through the wafer;
disposing a conductive material at least filling in the through holes;
disposing a dielectric material on the wafer covering the conductive material; and
removing a portion of the dielectric material for forming the through semiconductor vias and the bonding structure.

19. The manufacturing method of the package structure according to claim 18, wherein the wafer has a recessed region and an annular protruding region surrounding the recessed region, and the step of forming the through semiconductor vias and the bonding structure further comprising:
forming the through holes penetrating through the recessed region of the wafer; and
removing a portion of the annular protruding region of the wafer and the portion of the dielectric material for forming the through semiconductor vias and the bonding structure.

20. The manufacturing method of the package structure according to claim 17, wherein the step of bonding the dielectric layer and the bonding connectors with the insulating layer and the circuit layer respectively comprising:

disposing the semiconductor die on the redistribution structure, so that the dielectric layer being contacted to the insulating layer, and so that the bonding connectors being contacted to the circuit layer; and heating the redistribution structure and the semiconductor die disposed thereon, so that the dielectric layer and the bonding connectors being bonded with the insulating layer and the circuit layer respectively.

\* \* \* \* \*